(12) United States Patent
Hochschild

(10) Patent No.: US 7,420,493 B2
(45) Date of Patent: Sep. 2, 2008

(54) EXTENDED RANGE DELTA-SIGMA MODULATOR AND DELTA-SIGMA POWER CONVERTER

(75) Inventor: James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/651,857

(22) Filed: Jan. 10, 2007

(65) Prior Publication Data

US 2008/0165042 A1 Jul. 10, 2008

(51) Int. Cl.
*H03M 3/00* (2006.01)

(52) U.S. Cl. .................. 341/143; 341/144; 341/155

(58) Field of Classification Search .......... 341/118, 341/143, 144, 155
See application file for complete search history.

(56) References Cited

U.S. PATENT DOCUMENTS

| 5,055,843 A | * | 10/1991 | Ferguson et al. ......... 341/143 |
| 5,598,158 A | * | 1/1997 | Linz ...................... 341/143 |
| 5,818,374 A | * | 10/1998 | Tan ........................ 341/143 |
| 6,400,297 B1 | * | 6/2002 | Tucker .................... 341/143 |
| 6,621,435 B2 | * | 9/2003 | Cusinato et al. ........... 341/143 |
| 6,940,438 B2 | * | 9/2005 | Koe et al. ................ 341/143 |
| 7,084,797 B2 | * | 8/2006 | Yokoyama et al. ......... 341/143 |
| 7,193,546 B1 | * | 3/2007 | Melanson ................ 341/143 |
| 7,215,270 B1 | * | 5/2007 | Kozak et al. ............. 341/143 |
| 2006/0164272 A1 | * | 7/2006 | Philips et al. ............ 341/143 |

* cited by examiner

*Primary Examiner*—Khai M Nguyen
(74) *Attorney, Agent, or Firm*—Warren L. Franz; Wade J. Brady, III; Frederick J. Telecky, Jr.

(57) ABSTRACT

Devices, systems, and methods for providing delta-sigma modulation in conjunction with analog-to-digital or digital-to-analog signal conversion are disclosed. The delta-sigma modulator and delta-sigma converter include dynamically-scalable coefficients, which, at relatively low signal amplitudes, allow the delta-sigma modulator and delta-sigma converter to modulate the signals using a first noise transfer function and, at relatively greater signal amplitudes, allow the delta-sigma modulator and delta-sigma converter to modulate the signals using a second noise transfer function.

20 Claims, 11 Drawing Sheets

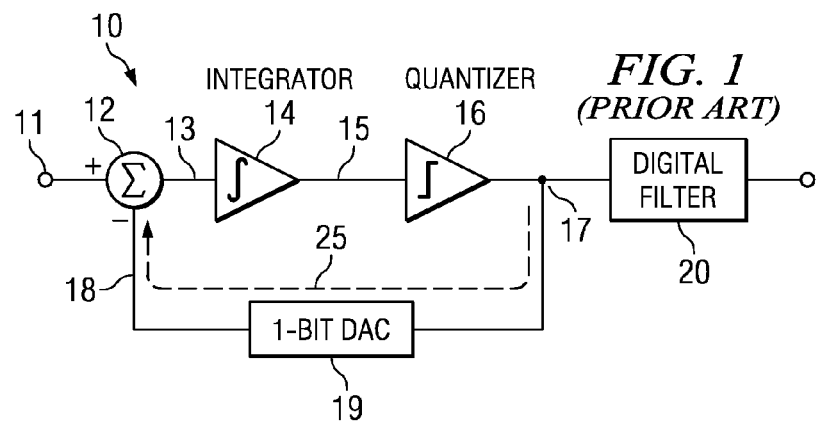
FIG. 1
*(PRIOR ART)*
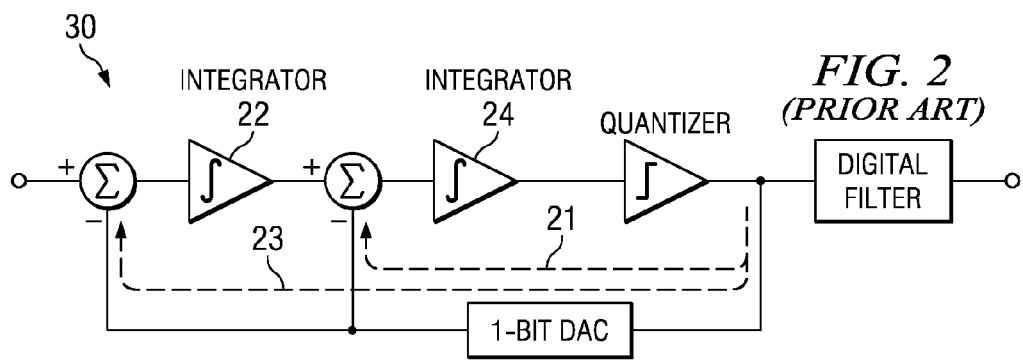
FIG. 2
*(PRIOR ART)*
FIG. 3
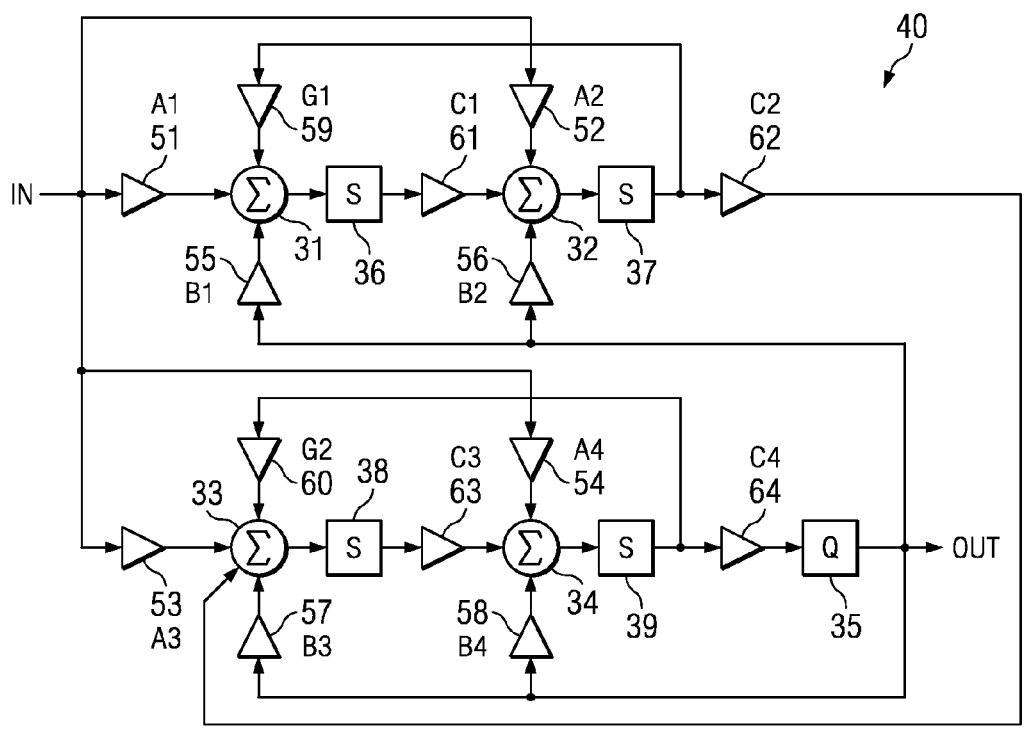

EXTENDED RANGE DELTA-SIGMA MODULATOR AND DELTA-SIGMA POWER CONVERTER

CROSS REFERENCE TO RELATED APPLICATIONS (Not applicable)

STATEMENT REGARDING FEDERALLY SPONSORED RESEARCH OR DEVELOPMENT (Not applicable)

BACKGROUND OF THE INVENTION

The present invention relates to delta-sigma modulation for analog-to-digital or digital-to-analog converters and, more particularly, to fourth-order delta-sigma modulation that includes dynamically altering the noise transfer function to provide an extended range of maximum, stable output amplitudes.

Power converters, which convert an AC input into a DC output, and power inverters, which convert a DC input into an AC output, (hereinafter, unless otherwise specified, referred to collectively as "converters") are used in power electronics to provide a desired output. Furthermore, converters are adapted to convert analog to digital or digital to analog. As with most power electronics, control plays a big factor in design. Indeed, external control of power converters is necessary to provide improved regulation of the output signal. Some of the various means of external control include delta modulation and delta-sigma modulation.

Delta modulation for analog-to-digital signal conversion involves approximating an analog signal using a series of digital segments. Each of the digital segments is then compared to the original analog signal to determine any change (i.e., an increase or decrease) in relative amplitude. This increase or decrease associated with each segment determines the state of successive bits in the bit stream. For example, if there is no change in the relative amplitude, the modulated output signal remains at the digital 0 (zero) or 1 state; whereas, if there is a change in relative amplitude, then the modulated output signal changes from 0 or 1 accordingly.

Delta-sigma ($\Delta\Sigma$) modulation is a hybrid analog-to-digital or digital-to-analog delta modulation technique. During $\Delta\Sigma$ modulation, an error (difference) between the input signal and a negative feedback signal is determined, then integrated. The integrated error is then compensated for by a comparator (or quantizer). The error value output is also fed back, inverted, and summed with the input signal. Accordingly, the mean output value is equal to the mean input value.

Delta-sigma ($\Delta\Sigma$) modulators differ from more "conventional" modulators in that they include a delta-sigma ($\Delta\Sigma$) converter, for converting an analog input signal into a digital bit stream, and a filter, which adds gain to the average signal level out of the bit stream. An example of a first-order $\Delta\Sigma$ modulator 10 is shown in FIG. 1.

The analog input signal 11 and an analog feedback signal 18 from a digital-to-analog converter (DAC) 19 are summed at summer 12. Those skilled in the art can appreciate that the input signal 11 and the feedback signal 18 could also be digital signals without departing from the scope or spirit of this disclosure. The difference between or error 13 of the two signals 11 and 18 from the summer 12 is integrated by an integrator 14. The integrated error signal 15 then enters a quantizer 16, which includes a pre-determined threshold value. The integrated error is either higher or lower or equal to the pre-determined threshold value. The digital output signal 17 of the quantizer 16 is filtered by a low-pass filter 20 and is also fed back to the summer 12 through the DAC 19.

Whenever signals are represented digitally, which is to say whenever signals are quantized, the imprecision in the conversion from analog-to-digital or from digital-to-analog unavoidably produces error between the continuous analog signal and the quantized digital signal. This error consists of additive, white (quantization) noise. The amount of quantization noise depends on the order of the modulator and the oversampling ratio.

The number of integrators and the number of feedback loops determine the "order" of the $\Delta\Sigma$ modulator. The $\Delta\Sigma$ modulator 10 in FIG. 1 is a "first-order" modulator because there is a single integrator 14 and a single feedback loop 25. A second-order $\Delta\Sigma$ modulator 30 is shown in FIG. 2. The second-order $\Delta\Sigma$ modulator 30 includes two integrators 22 and 24 and two feedback loops 21 and 23.

Better signal-to-noise performance implies a higher signal-to-noise ratio (SNR). Hence, a relatively high SNR is desirable. At DC (no frequency) and relatively low frequencies, such as between 0 and about 1,000 Hertz (Hz), increasing the order of an $\Delta\Sigma$ modulator results in a higher SNR and, accordingly, better signal-to-noise performance. Consequently, for small amplitude signals at DC or relatively low frequencies, output precision is improved by using higher-order $\Delta\Sigma$ modulators.

SNR of higher-order $\Delta\Sigma$ modulators at higher frequencies, however, is lowered. Moreover, with higher-order $\Delta\Sigma$ modulators, the maximum amplitude of the output signal beyond which the modulator becomes unstable is reduced. For many modulators, this does not pose a problem because the quantized output signal can simply be amplified. This is not the case for all $\Delta\Sigma$ modulators.

For example, in DAC systems in which the $\Delta\Sigma$ modulator directly drives an output bridge circuit in which the output(s) is/are switched to various reference voltages, depending on the $\Delta\Sigma$ output level, amplification prior to the output is not possible. In the case of a three-level $\Delta\Sigma$ output directly driving a differential H-bridge output, the bridge outputs are switched depending on the $\Delta\Sigma$ output in accordance with the following:

| $\Delta\Sigma$ Level | $V_{OUT+}$ | $V_{OUT-}$ |
|---|---|---|
| +1 | $V_{REF+}$ | $V_{REF-}$ |
| −1 | $V_{REF-}$ | $V_{REF+}$ |
| 0 | $V_{REF+}$ | $V_{REF+}$ or |
|   | $V_{REF-}$ | $V_{REF-}$ |

The $\Delta\Sigma$ modulator drives and tracks the output signal directly without intervening signal processing. Hence, the reduced maximum, stable output amplitude limits the maximum output signal deliverable, which is to say, conventional $\Delta\Sigma$ modulation limits the range of maximum output signal amplitudes that can be delivered. For example, regardless of stability, a conventional fourth-order $\Delta\Sigma$ modulator having three quantizer levels (+1, 0, −1) may have a maximum stable output of about −6 dB relative to the maximum possible digital output amplitude. Notwithstanding the reduction in SNR for higher amplitude signal values, in certain $\Delta\Sigma$ modulator applications, such as voice or audio signal conversion, at relatively high signal amplitudes, better SNR performance can be sacrificed to increase the maximum output signal amplitude range because high signal amplitudes can better mask low levels of noise.

Therein lies the designer's dilemma: with smaller amplitude signals, higher-order ΔΣ modulators are highly desirable but with larger amplitude signals, lower-order ΔΣ modulators are more desirable. Switching between a higher- and lower-order ΔΣ modulators is one plausible solution. Indeed, dynamically varying the order of the ΔΣ modulator between higher-order ΔS modulators for smaller signals and lower-order ΔΣ modulators for larger signals is feasible. However, such modulation can result in relatively large and abrupt decreases in SNR for moderate to high oversampling ratios. Oversampling ratios (OSR) involve sampling a signal at a sampling frequency significantly higher than two times the bandwidth or highest frequency of the signal being sampled. For example, decreasing a three-level modulator's order from four to two at an OSR of 32 can cause an abrupt 26 dB reduction in SNR when the transition is made.

Therefore, it would be desirable to provide a ΔΣ converter as well as a ΔΣ modulator that are adapted to dynamically-control higher-order ΔΣ modulation and, moreover, that are adapted to dynamically-control higher-order ΔΣ modulation to provide a high SNR at relatively low signal amplitude levels using a first noise transfer function; but that is "detunable" at relatively greater signal amplitude levels using a second noise transfer function, to provide a greater range of stable, output signal amplitudes.

BRIEF SUMMARY OF THE INVENTION

Devices, systems, and methods for providing delta-sigma modulation in conjunction with analog-to-digital or digital-to-analog signal conversion are disclosed. The delta-sigma modulator and delta-sigma converter include dynamically-scalable coefficients, such as coupling coefficients and feedback resonator coefficients, which, at relatively low signal amplitudes, allow the delta-sigma modulator and delta-sigma converter to modulate the signals using a first noise transfer function and, at relatively greater signal amplitudes, allow the delta-sigma modulator and delta-sigma converter to modulate the signals using a second noise transfer function.

BRIEF DESCRIPTION OF THE SEVERAL VIEWS OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views.

FIG. 1 shows a block diagram of a first-order delta-sigma modulator and converter;

FIG. 2 shows a block diagram of a second-order delta-sigma modulator and converter;

FIG. 3 shows a block diagram of a fourth-order delta-sigma modulator in accordance with the present invention;

DETAILED DESCRIPTION OF THE INVENTION

Figure 4:
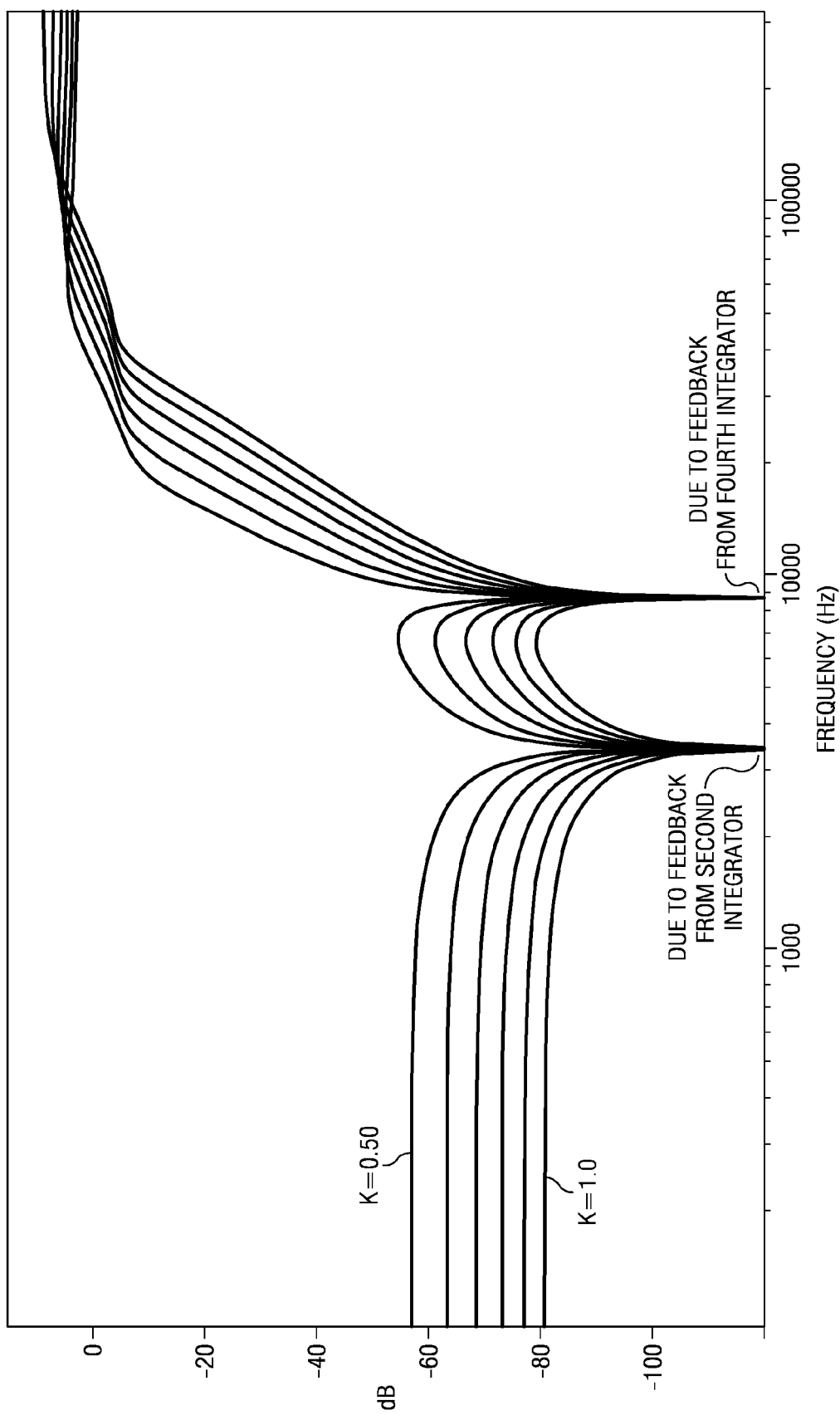
FIG. 4 shows a delta-sigma modulator noise transfer function.

The present invention discloses devices, systems, and methods for dynamically-controlling delta-sigma modulation in conjunction with analog-to-digital or digital-to-analog conversion to provide a greater range of maximum, stable output signal amplitudes. More specifically, the devices, systems, and methods of the present invention dynamically are adapted to dynamically alter the delta-sigma modulator noise transfer function to "detune" the delta-sigma (ΔΣ) modulator when the input signal has a relative high signal amplitude within the band of interest; while the delta-sigma (ΔΣ) modulator uses a different noise transfer function at relatively low signal amplitudes within the band of interest. Advantageously, the noise transfer function is altered in such a way as to preserve the signal gain, maintain stability, minimize audible artifacts, and extend the maximum stable output range.

A block diagram of an exemplary higher-order, e.g., fourth-order, ΔΣ modulator 40 is shown in FIG. 3. Although FIG. 3 shows a digital embodiment, the teachings of this specification are equally applicable to analog modulators. Indeed, the ΔΣ converter can be analog-to-digital (ADC) or digital-to-analog (DAC).

The ΔΣ modulator 40 includes a plurality of, e.g., four, summers 31, 32, 33, and 34, a plurality of, e.g., four, integrators 36, 37, 38, and 39, and a quantizer block 35. Each of the digital components are of a type well known to those skilled in the art and will not be described in detail.

In operation, a continuous digital signal IN is transmitted to each of the summers 31, 32, 33, and 34 and processed through the integrators 36, 37, 38, and 39 downstream of the summers. At the quantizer block 35, the integrated (input) signal is compared to at least one, pre-determined, threshold value; encoded; and digitally output, e.g., as a two-bit stream. The output OUT of the quantizer block 35 then drives a switching device (not shown), e.g., an H-bridge.

Typically, a three-level quantizer block 35 has two threshold values: a high threshold value and a low threshold value. Thus, when the integrated signal is lower than the low threshold value, the output is −1. When the integrated signal is higher than the high threshold value, the output is +1. When the integrated signal is between the low and the high threshold values, the output is 0.

Controllable digital multipliers 51-64 are also provided to alter the signal input therein. For example, the digital input signal IN is processed into each of the summers 31, 32, 33, and 34, respectively, through digital multipliers 51, 52, 53, and 54. The coefficients of the digital multipliers 51, 52, 53, and 54 are A1, A2, A3, and A4, respectively. The output OUT of the quantizer block 35 is also fed back to each of the summers 31, 32, 33, and 34, respectively, via digital multipliers 55, 56, 57, and 58 having coefficients B1, B2, B3, and B4.

Output from each integrator 36, 37, 38, and 39 is further processed through digital multipliers 61, 62, 63, and 64 having coupling coefficients C1, C2, C3, and C4, respectively. Output from digital multipliers 61, 62, and 63 is input into summers 32, 33, and 34, respectively. Output from digital multiplier 64 is input into the quantizer block 35.

Output from the second integrator 37 is also fed back into the first summer 31 via digital multiplier 59. Output from the fourth integrator 39 is also fed back into the third summer 33 via digital multiplier 60. Digital multipliers 59 and 60 have resonator feedback coefficients G1 and G2, respectively.

With conventional modulators and converters, scaling coefficients A, B, C, and G are fixed to perform a predetermined, desired modulation. According to the present invention, however, the coupling coefficients (C1-C4) and the resonator feedback coefficients (G1 and G2) can be dynamically scaled to "detune" the ΔΣ modulator noise transfer function when the input signal IN has a relatively large amplitude. More specifically, the coupling coefficients (C1-C4) and the resonator feedback coefficients (G1 and G2) can be dynamically scaled so that different coupling coefficients (C1-C4) and different resonator feedback coefficients (G1 and G2) are used depending on whether the input signal IN has a small versus a large input amplitude. Those skilled in the art can appreciate that other coefficients besides the coupling coefficients (C1-C4) and resonator feedback coefficients (G1 and G2) can be dynamically scaled to provide a similar result.

Advantageously, dynamic scaling of the coupling coefficients (C1-C4) and resonator feedback coefficients (G1 and G2) alters the noise transfer function, which enables controlling the "noise floor" or ambient noise level at any frequency within the band of interest, i.e., between DC (no frequency) and about 10 kilohertz (kHz), without having to change the order of the ΔΣ modulator 40.

For example, coupling coefficients (C1-C4) can be dynamically scaled by a scaling factor K and resonator feedback coefficients (G1 and G2) can be dynamically scaled by a scaling factor 1/K, where $0 < K \leq 1$. The effect of altering the noise transfer function is shown in FIG. 4. FIG. 4 shows a noise transfer function family of curves for a ΔΣ modulator 40. The noise transfer function family of curves correspond to scaling factors K that vary from K=1.0, 0.9, 0.8, 0.7, 0.6, and 0.5.

The bottom-most curve corresponds to the K=1.0 condition. The top-most curve corresponds to the K=0.5 condition. As shown in FIG. 4, between DC (zero frequency) and about 1 kHz of the band of interest, e.g., between DC and about 10 kHz, the "noise floor" for K=1.0 is about −80 dB and the "noise floor" for K=0.5 is about −60 dB. Consequently, the K=0.5 condition is shown to degrade the "noise floor", resulting in a lower SNR. As a result, when the amplitude of the input signal IN is relatively small and the signal is less able to mask the "noise floor", the coupling coefficients (C1-C4) and the resonator feedback coefficients (G1 and G2) are maintained at unity for the K=1.0 condition to provide a higher SNR.

With increasingly greater signal amplitudes, within the same band of interest, the signal has an inherently greater ability to mask the "noise floor". Consequently, to extend the range of maximum stable input signals, it is feasible to increase the level of the noise floor and accept a lower SNR. For example, from computer modeling and experimentation conducted by the inventor, the maximum stable output amplitude goes from −6 dB to greater than about −1 dB when the scaling value K transitions directly from for K=1.0 to K=0.5. Moreover, during such a transition, the SNR is degraded by about 19 dB.

However, to extend the range of the maximum stable output signal amplitudes, it is necessary to "detune" the ΔΣ modulator 40, which is to say, it is necessary to use a different noise transfer function from the one used at lower signal amplitudes. Accordingly, the ΔΣ modulator 40 includes sensing and switching means (not shown) to detect when the input signal amplitude exceeds −6 dB. Although monitoring the output signal magnitude is possible, monitoring the input signal amplitude is simpler. Indeed, monitoring output signal magnitude requires filtering to attenuate the large amount of out-of-band quantization noise. Monitoring the input signal magnitude reduces the delay associated with deciding whether or not to reduce the K coefficient. Excessive delay associated with reducing the K coefficient can cause the ΔΣ modulator 40 to become momentarily unstable.

Those skilled in the art will appreciate that the value −6 db can vary between modulators. For ease and clarity of discussion, however, the threshold maximum stable input amplitude is assumed to be −6 dB. Thus, when the input signal amplitude is below −6 dB, the fourth-order ΔΣ modulator 40 operates in a normal mode using a first noise transfer function. However, when the input signal amplitude exceeds −6 dB, the ΔΣ modulator 40 is switched to operate in an extended range mode using a second noise transfer function.

Figure 5A:
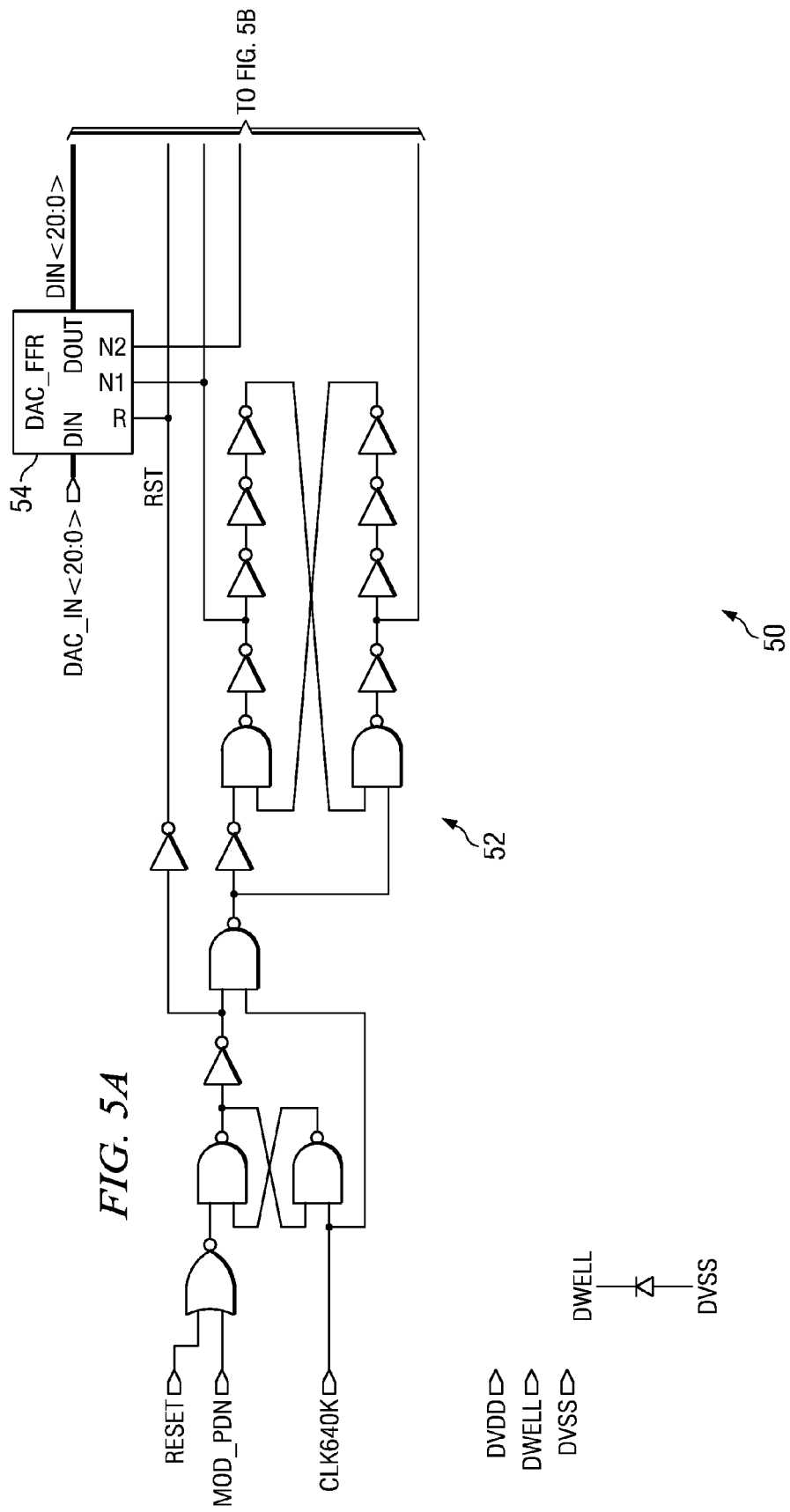
FIGS. 5A-B show a circuit diagram of an embodiment of a delta-sigma DAC modulator with extended range in accordance with the present invention.
Figure 5B:
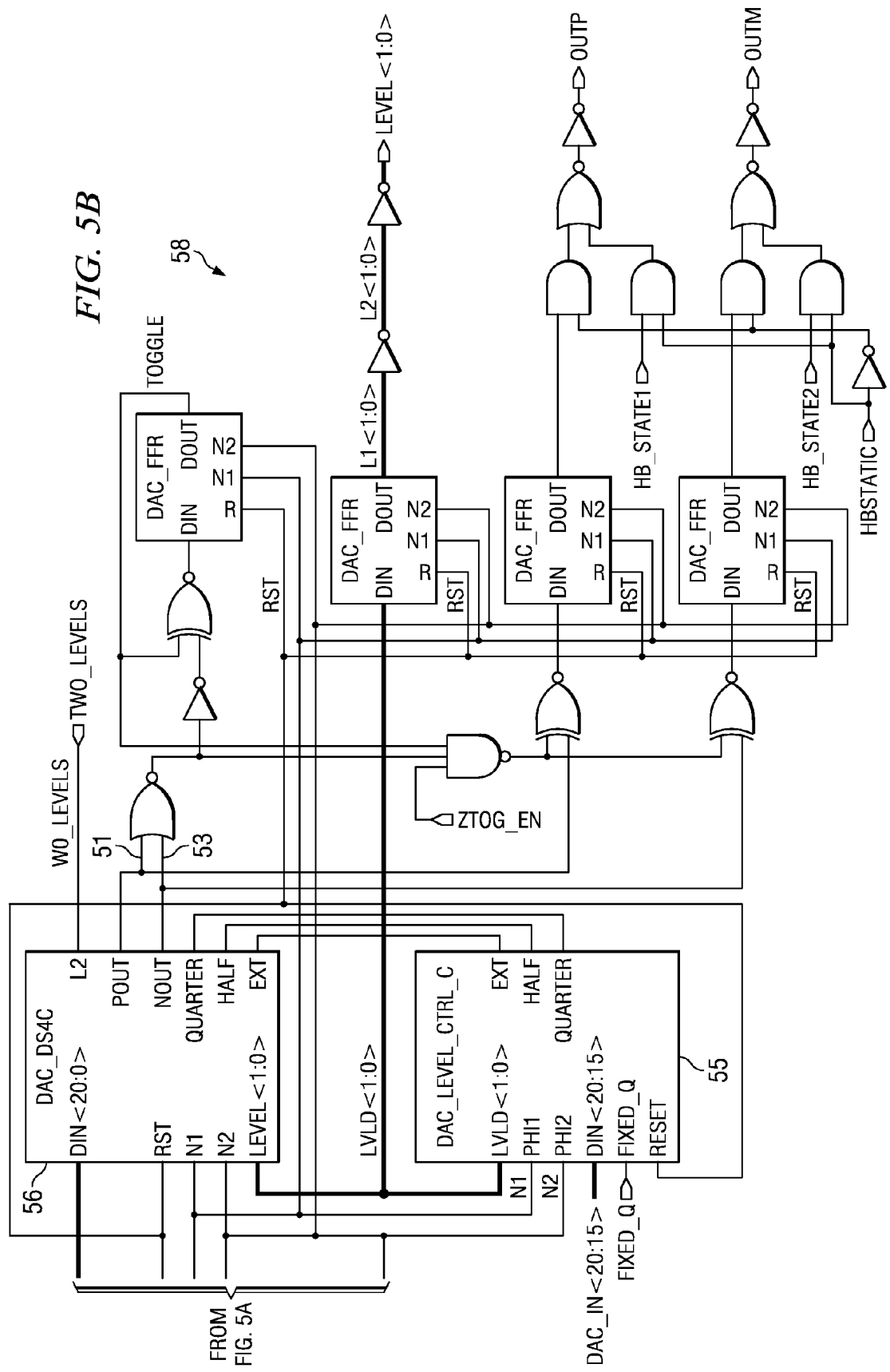

The operation of the ΔΣ modulator 40 will now be described referring to the logic diagrams in FIGS. 5A-B, 6A-C and 7A-D. FIGS. 5A-B show a schematic diagram of a ΔΣ DAC modulating system 50 having an extended range capability. The ΔΣ DAC modulating system 50 includes logic elements adapted for controlling the clock pulse and phase delays 52, logic elements adapted for shaping the output pulse 58, a register 54, the ΔΣ modulator 56, and a modulation changing device 55.

The modulation changing device 55 includes logic elements adapted to determine whether to signal the ΔΣ modulator 56 to operate in a normal mode or to operate in an extended range mode. More specifically, the modulation changing device 55 reads the amplitude of the input signal and compares it to the threshold value (−6 dB). If the amplitude of the input signal does not exceed the threshold value, then the modulation changing device 55 signals the ΔΣ modulator 56 to use the noise transfer function associated with scaling factor K=1.0. However, if the amplitude of the input signal exceeds the threshold value, then the modulation changing device 55 signals the ΔΣ modulator 56 to use the noise transfer function associated with extended range scaling factor K=0.5.

Figure 6A:
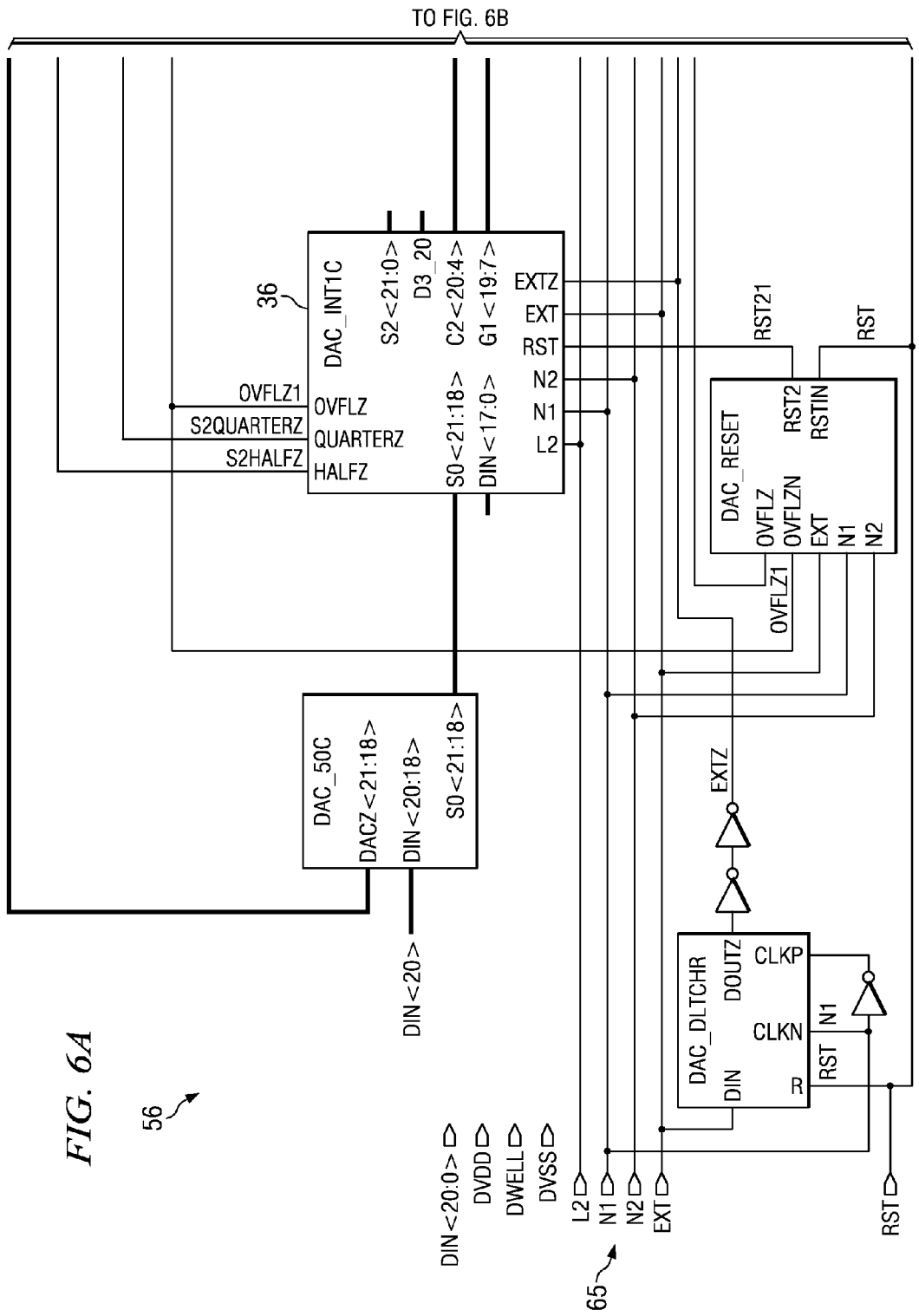
FIGS. 6A-C show a circuit diagram of a modulator core in accordance with the present invention.
Figure 6B:
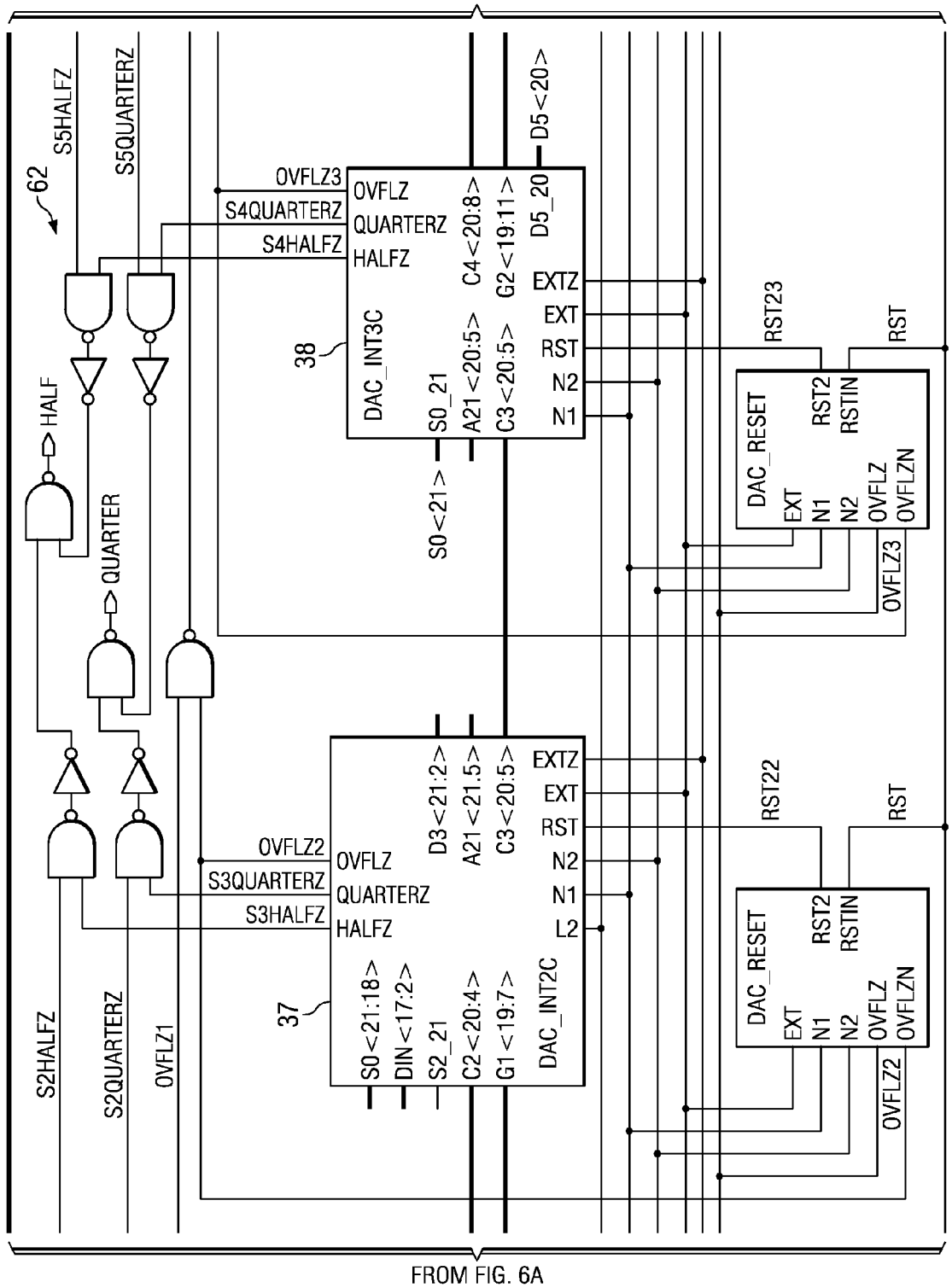
Figure 6C:
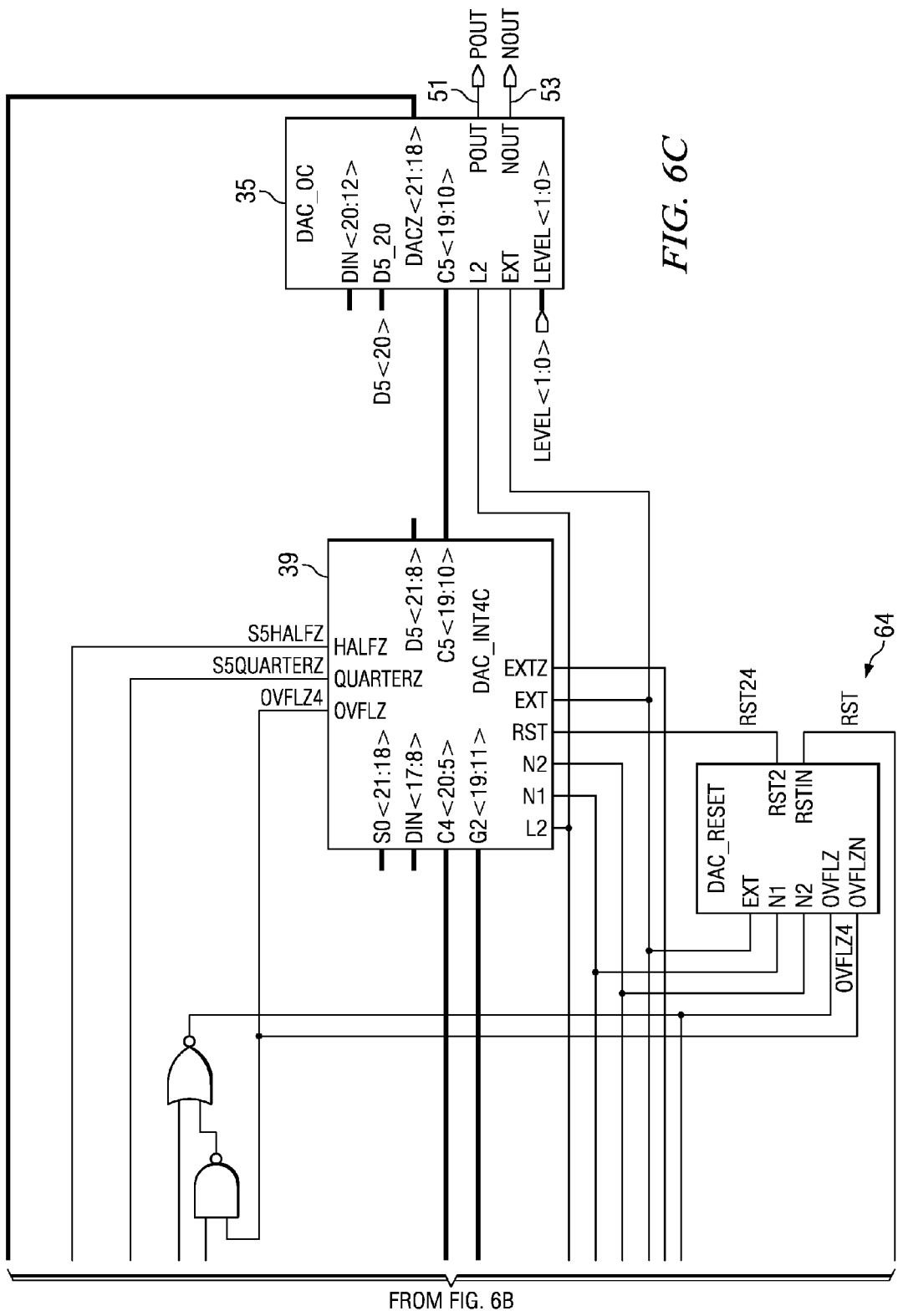
Figure 7A:
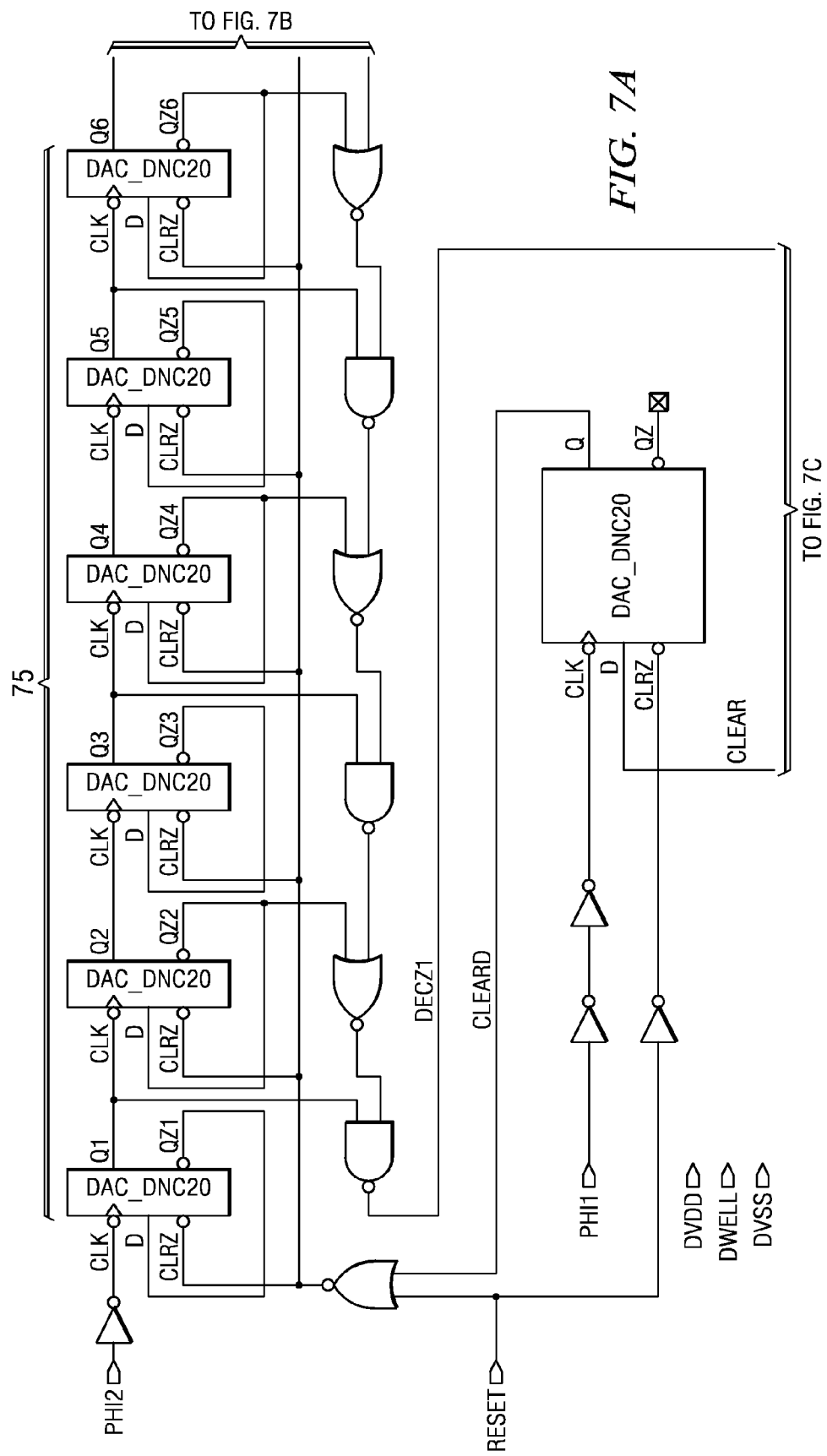
FIGS. 7A-D show a circuit diagram of an extended range control for a delta-sigma DAC modulator in accordance with the present invention.
Figure 7B:
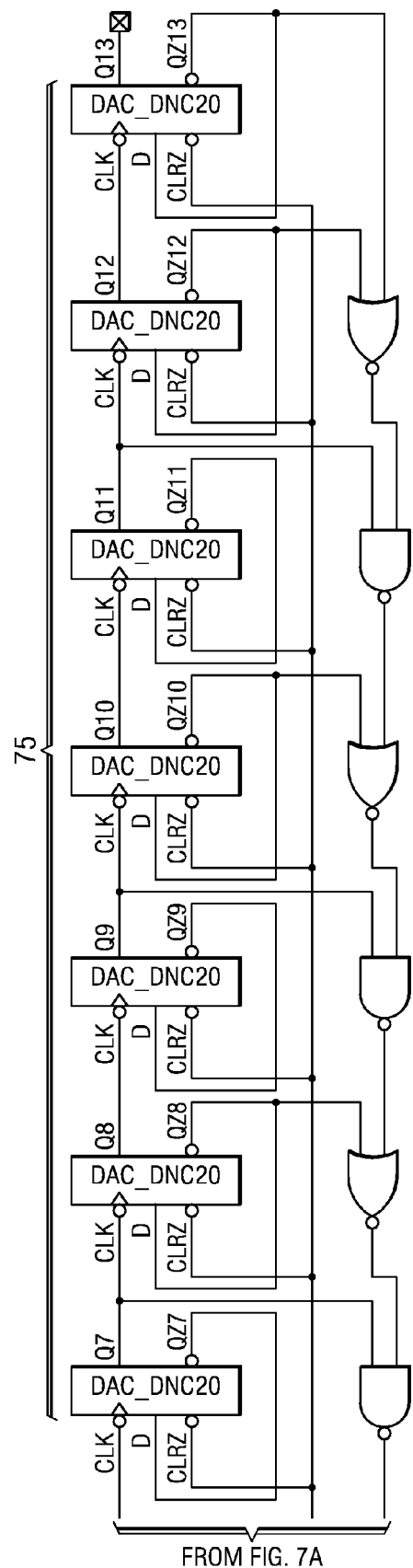
Figure 7C:
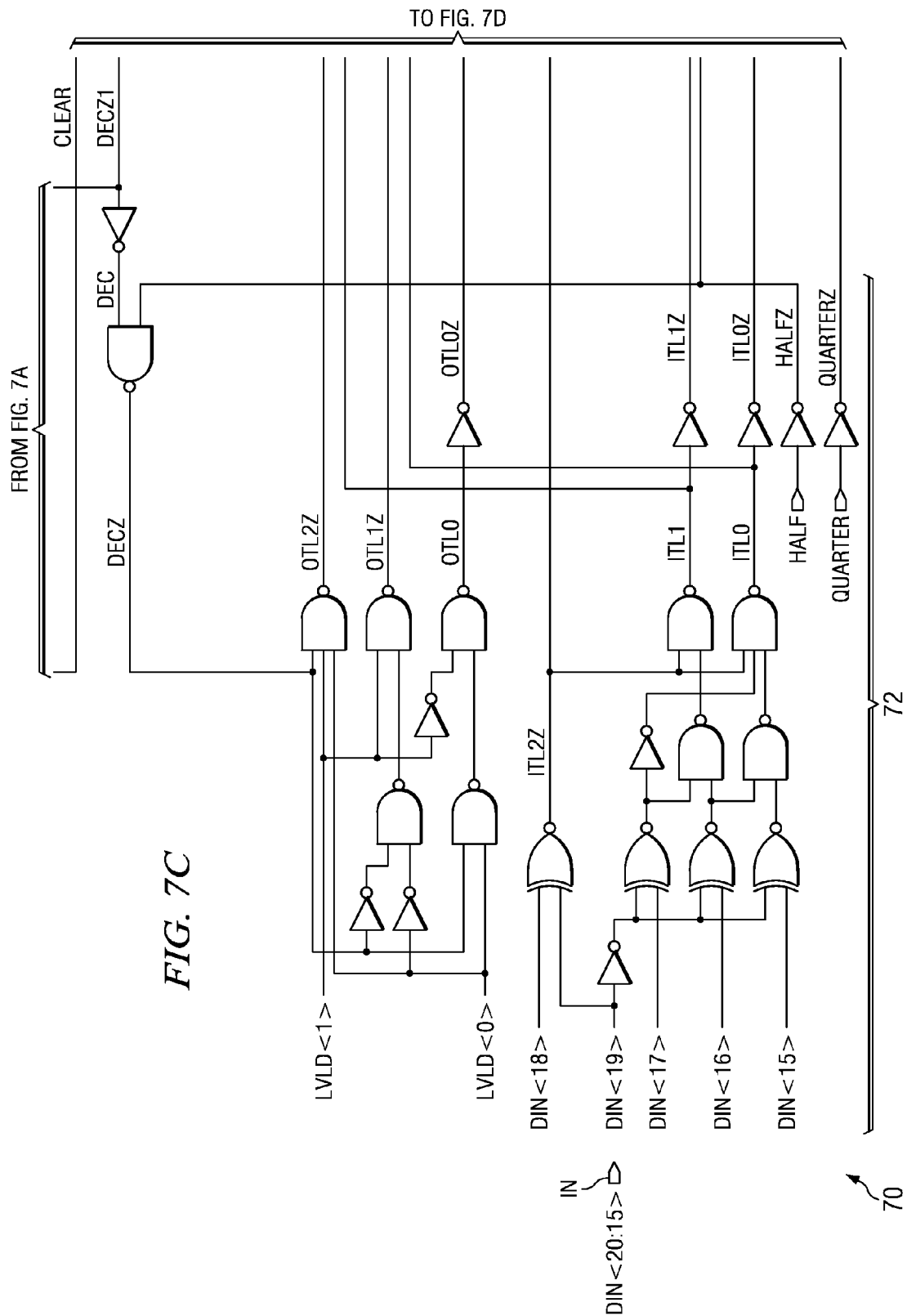
Figure 7D:
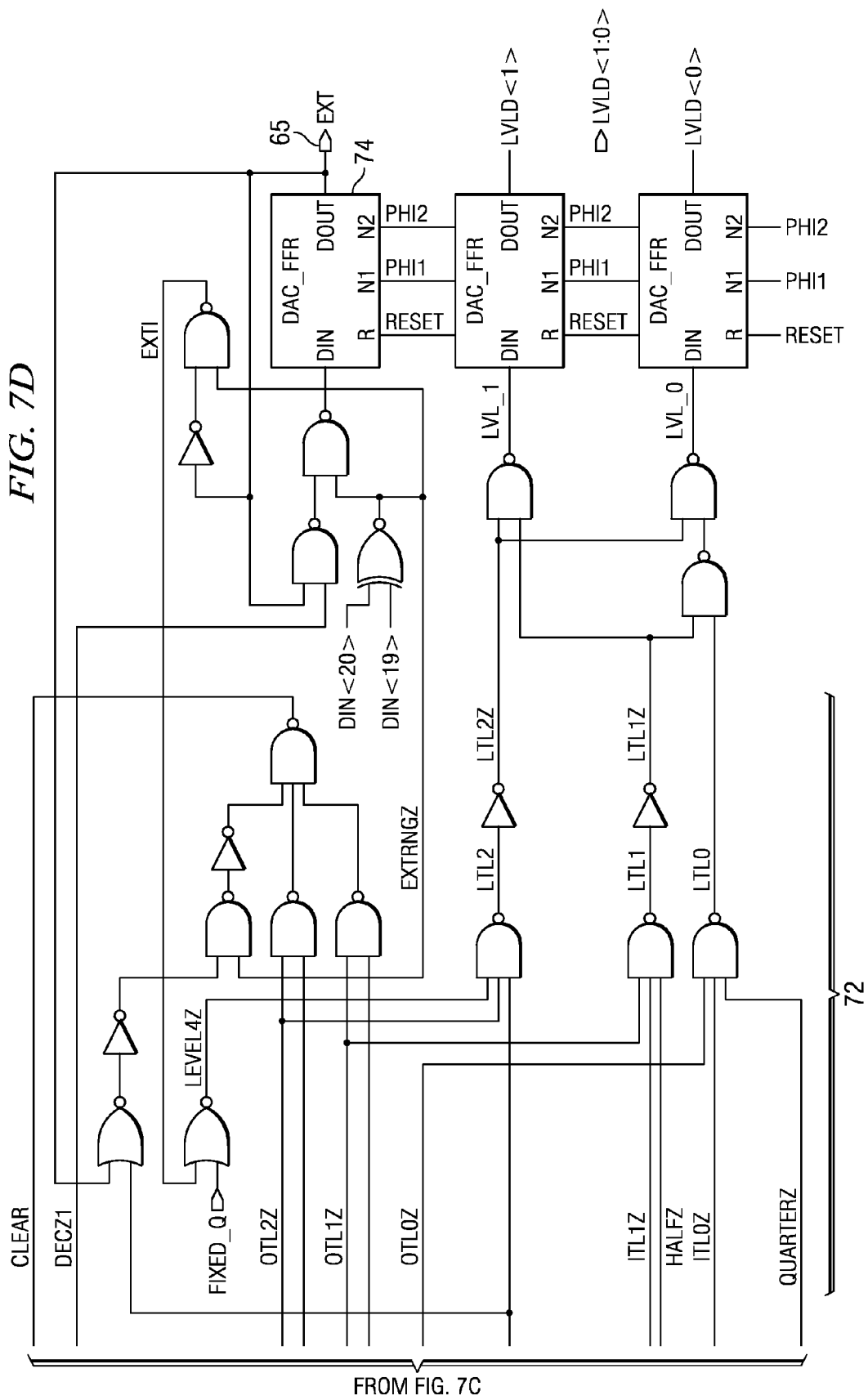

FIGS. 6A-C show a schematic diagram of the ΔΣ modulator 56. The ΔΣ modulator 56 includes four integrators 36, 37, 38, and 39 and a quantizer block 35. Logic elements for detecting an overflow condition 62 are provided as are logic elements 64 for stabilizing the ΔΣ modulator 56 during an overflow condition.

The EXT control signal 65 from the modulation changing device 55 is transmitted to each of the integrators 36, 37, 38, and 39, altering the scaling factor K of the coupling coefficients (C1-C4) and the resonator feedback coefficients (G1 and G2) as appropriate. Thus, when the amplitude of the input signal does not exceed the threshold value (−6 dB), the EXT signal 65 causes the integrators 36, 37, 38, and 39 to use the normal scaling factor K=1.0 and the coupling coefficients (C1-C4) and the resonator feedback coefficients (G1 and G2) become unity. When, on the other hand, the amplitude of the input signal exceeds the threshold value (−6 dB), the EXT signal 65 causes the integrators 36, 37, 38, and 39 to use the extended range scaling factor K=0.5 and the coupling coefficients. (C1-C4) and the resonator feedback coefficients (G1 and G2) become 0.5 and 2, respectively. Thus, a ΔΣ modulator and ΔΣ converter having a greater range of maximum, stable output amplitudes within the band of interest is provided.

Referring to FIGS. 7A-D, a schematic diagram of the EXT signal controlling device 70 is shown. The EXT signal controlling device 70 includes logic elements adapted to detect the input signal level 72, logic elements adapted to minimize excessive toggling between normal and extended range modes of operation 75, and a flip flop circuit 74. The digital input signal IN or, more specifically, the most significant bit (MSB), is transmitted to the logic elements 72 which determine whether or not the input signal level exceeds the threshold value (−6 dB). These data are then transmitted to the flip flop circuit 74.

To avoid excessive toggling between the normal and the extended range modes of operation, logic elements 75, such as counters, can be arrayed to produce a delay before sending the EXT control signal 65 to the ΔΣ modulator 56. With the present invention, delay is not desirable when transitioning from the normal mode to the extended range mode, i.e., when the EXT signal transitions from a low state to a high state. However, when transitioning from the extended range mode back to the normal mode, i.e., when the EXT signal transitions from a high state to a low state, delay may be desirable. Such delay, however, should not cause a momentarily audible increase in the noise floor.

As a result, before a transitioning EXT control signal 65 from the extended range mode to the normal mode is transmitted, a pre-determined number of delays having a signal level below the threshold value (−6 dB) must transpire. Otherwise, the ΔΣ modulator 56 may undesirably toggle back and forth between normal and extended range modes for any short-term spike condition.

While the invention is described through the above-described exemplary embodiments, it will be understood by those of ordinary skill in the art that modifications to, and variations of, the illustrated embodiments may be made without departing from the inventive concepts disclosed herein. Accordingly, the invention should not be viewed as limited, except by the scope and spirit of the appended claims.

What is claimed is:

1. A dynamically-controllable delta-sigma modulating device for providing a range of output amplitudes to at least one of an analog-to-digital converter and a digital-to-analog converter, the modulating device comprising:
   a plurality of summing circuits disposed serially;
   a quantizer block disposed after a last of the plurality of summing circuits, the quantizer block having a feedback loop to each summing circuit of said plurality of summing circuits;
   a plurality of integrator circuits, each of the plurality of integrator circuits being disposed between successive summing circuits of said plurality of summing circuits and between the last of the plurality of summing circuits and said quantizer block;
   a first plurality of multiplier circuits, each of the first plurality of multiplier circuits being disposed between each of the plurality of integrator circuits and an adjacent summing circuit of said plurality of summing circuits and between a last of said plurality of integrator circuits and said quantizer block, each multiplier circuit of said first plurality of multiplier circuits having a first dynamically-scalable coefficient;
   a first resonator feedback loop providing a first resonator feedback via a first resonator coefficient multiplier circuit having a second dynamically-scalable coefficient; and
   a second resonator feedback loop providing a second resonator feedback via a second resonator coefficient multiplier circuit having a third dynamically-scalable coefficient;
   wherein each of the dynamically-scalable coefficients can be altered to provide a desired noise transfer function within a band of interest.

2. The modulating device as recited in claim 1, wherein the first dynamically-scalable coefficient is equal to a scaling factor K, where $0 < K \leq 1$.

3. The modulating device as recited in claim 2, wherein the scaling factor value of K for dynamically scaling the first coefficient for a normal mode of operation is equal to 1.0 and the scaling factor value of K for dynamically scaling the first coefficient for an extended range mode of operation is equal to 0.5.

4. The modulating device as recited in claim 1, wherein the second and third dynamically-scalable coefficients for each of the first and second resonator feedback loop are equal to a scaling factor 1/K, where $0 < K \leq 1$.

5. The modulating device as recited in claim 4, wherein the scaling factor value of K for dynamically scaling the second and third coefficients for a normal mode of operation is equal to 1.0 and the scaling factor value of K for dynamically scaling the second and third coefficients for an extended range mode of operation is equal to 0.5.

6. The modulating device as recited in claim 1, wherein the first resonator feedback loop feeds back an output signal from a second integrator to a first summing circuit disposed at an input of a first integrator; and
   the second resonator feedback loop feeds back an output signal from a fourth integrator to a third summing circuit disposed at an input of a third integrator.

7. The modulating device as recited in claim 1 further comprising a modulation changing device for determining whether to operate said modulating device in a normal mode or in an extended range mode based on a comparison between at least one threshold value and an amplitude of an input signal.

8. The modulating device as recited in claim 7, wherein the modulation changing device is adapted to provide normal mode signals to dynamically scale the coefficients when the amplitude of the input signal does not exceed the at least one threshold value.

9. The modulating device as recited in claim 7, wherein the modulation changing device is adapted to provide extended range mode signals to dynamically scale the coefficients when the amplitude of the input signal exceeds the at least one threshold value.

10. The modulating device as recited in claim 1, wherein the band of interest is between DC (no frequency) and about 10,000 Hertz.

11. The modulating device as recited in claim 10, wherein small signal levels in the band of interest are between DC (no frequency) and about 1,000 Hertz and large signal levels are between about 1,000 Hertz and about 10,000 Hertz.

12. The modulating device as recited in claim 1, wherein a first noise transfer function provides relatively high signal-to-noise ratio for relatively smaller amplitude signals and a second noise transfer function provides a greater range of output signal amplitudes for relatively larger amplitude signals.

13. A delta-sigma modulator having a range of output amplitudes, the converter comprising:
   a low-pass filter; and
   a dynamically-controllable delta-sigma converter, the converter comprising:
     a plurality of summing circuits disposed serially;
     a quantizer block disposed after a last of the plurality of summing circuits, the quantizer block having a feedback loop to each summing circuit of said plurality of summing circuits;
     a plurality of integrator circuits, each integrator circuit of the plurality of integrator circuits being disposed between successive summing circuits of said plurality of summing circuits and between the last of the plurality of summing circuits and said quantizer block;

a first plurality of multiplier circuits, each multiplier circuit of the first plurality of multiplier circuits being disposed between each integrator circuit of the plurality of integrator circuits and an adjacent summing circuit of said plurality of summing circuits and between a last integrator circuit of said plurality of integrator circuits and said quantizer block, each multiplier circuit of said first plurality of multiplier circuits having a first dynamically-scalable coefficient;

a first resonator feedback loop providing a first resonator feedback via a first resonator coefficient multiplier circuit having a second dynamically-scalable coefficient; and a second resonator feedback loop providing a second resonator feedback via a second resonator coefficient multiplier circuit having a third dynamically-scalable coefficient;

wherein each of the dynamically-scalable coefficients can be altered to provide a desired noise transfer function within a band of interest.

14. The delta-sigma modulator as recited in claim 13, wherein a first noise transfer function provides relatively high signal-to-noise ratio for relatively smaller amplitude signals and a second noise transfer function provides a greater range of output signal amplitudes for relatively larger amplitude signals.

15. A dynamically-controllable delta-sigma converter having a range of output amplitudes for a delta-sigma modulator, the converter comprising:

a plurality of summing circuits disposed serially;

a quantizer block disposed after a last of the plurality of summing circuits, the quantizer block having a feedback loop to each summing circuit of said plurality of summing circuits;

a plurality of integrator circuits, each integrator circuit of the plurality of integrator circuits being disposed between successive summing circuits of said plurality of summing circuits and between the last of the plurality of summing circuits and said quantizer block;

a first plurality of multiplier circuits, each multiplier circuit of the first plurality of multiplier circuits being disposed between each integrator circuit of the plurality of integrator circuits and an adjacent summing circuit of said plurality of summing circuits and between a last integrator circuit of said plurality of integrator circuits and said quantizer block, each multiplier circuit of said first plurality of multiplier circuits having a first dynamically-scalable coefficient;

a first resonator feedback loop providing a first resonator feedback via a first resonator coefficient multiplier circuit having a second dynamically-scalable coefficient; and a second resonator feedback loop providing a second resonator feedback via a second resonator coefficient multiplier circuit having a third dynamically-scalable coefficient;

wherein each of the dynamically-scalable coefficients can be altered to provide a desired noise transfer function within a band of interest.

16. The dynamically-controllable delta-sigma converter as recited in claim 15, wherein a first noise transfer function provides relatively high signal-to-noise ratio for relatively smaller amplitude signals and a second noise transfer function provides a greater range of output signal amplitudes for relatively larger amplitude signals.

17. A method of dynamically-controlling delta-sigma signal modulation of at least one of a delta-sigma analog-to-digital or a delta-sigma digital-to-analog converter, to provide an extended range of output amplitudes, the method comprising:

sampling an input signal amplitude;

comparing the input signal amplitude to a threshold signal amplitude; and dynamically-altering a delta-sigma noise transfer function;

wherein altering the delta-sigma noise transfer function includes altering at least one of a first coefficient and a second coefficient, wherein the first coefficient is applied to an output from each of a plurality of integrators of the at least one delta-sigma analog-to-digital or delta-sigma digital-to-analog converter and the second coefficient is applied to an output from at least one of a plurality of integrators that is fed back to another of the plurality of integrators; and wherein the method includes transmitting normal mode signals to dynamically scale the first and second coefficients when the amplitude of the input signal does not exceed a threshold value, and transmitting extended range mode signals to dynamically scale said first and second coefficients when the amplitude of the input signal exceeds the threshold value.

18. The method as recited in claim 17, wherein said first dynamically-scalable coefficient is equal to a scaling factor K and said second dynamically-scalable is equal to a scaling factor 1/K, where $0 < K \leq 1$.

19. The method as recited in claim 18, wherein the scaling factor K value of for dynamically scaling said first and said second coefficients for a normal mode of operation is equal to 1.0 and the scaling factor value of K for dynamically scaling said first and said second coefficients for an extended range mode of operation is equal to 0.5.

20. The method as recited in claim 17 further comprising:

providing an array of delay devices to reduce toggling between a normal mode of operation and an extended range mode of operation when said input signal amplitude exceeds or does not exceed said threshold signal amplitude for only a brief, pre-determined number of delays.

* * * * *